(12) United States Patent
Hirota et al.

(10) Patent No.: US 7,515,422 B2
(45) Date of Patent: Apr. 7, 2009

(54) ELECTRIC POWER CONVERTER

(75) Inventors: Masayuki Hirota, Narashino (JP); Satoshi Ibori, Yachimata (JP); Tomoya Kamezawa, Narashino (JP); Jiangming Mao, Narashino (JP); Masahiro Hiraga, Yotsukaidou (JP)

(73) Assignee: Hitachi Industrial Equipment System Co., Tokyo (JP)

( * ) Notice: Subject to any disclaimer, the term of this patent is extended or adjusted under 35 U.S.C. 154(b) by 223 days.

(21) Appl. No.: 11/642,717

(22) Filed: Dec. 21, 2006

(65) Prior Publication Data

US 2007/0279864 A1 Dec. 6, 2007

(30) Foreign Application Priority Data

May 31, 2006 (JP) ............................. 2006-150874

(51) Int. Cl.
*H05K 7/20* (2006.01)
(52) U.S. Cl. ..................... 361/709; 361/690; 361/807; 174/351; 174/295
(58) Field of Classification Search ................. 363/131, 363/141–146, 37, 50, 55, 56.05; 361/690, 361/702–710, 715–725, 802, 807; 174/15.2, 174/16.3, 252, 295, 351; 257/718–719
See application file for complete search history.

(56) References Cited

U.S. PATENT DOCUMENTS 5,170,336 A * 12/1992 Getter et al. ................. 363/141
5,497,289 A * 3/1996 Sugishima et al. ........... 361/709
6,700,802 B2 * 3/2004 Ulinski et al. ................. 363/37
6,972,972 B2 * 12/2005 Duncan et al. ........... 363/56.01
6,992,409 B2 * 1/2006 Torii et al. ..................... 310/52
7,400,070 B2 * 7/2008 Asao et al. ..................... 310/58

FOREIGN PATENT DOCUMENTS

| CN | 1578076 | 2/2005 |
|---|---|---|
| EP | 0 693 820 | 1/1996 |
| EP | 1 503 617 | 2/2005 |
| JP | 03-256562 | 11/1991 |
| JP | 06-038546 | 2/1994 |
| JP | 2005-348533 | 12/2005 |

* cited by examiner

*Primary Examiner*—Rajnikant B Patel
(74) *Attorney, Agent, or Firm*—Antonelli, Terry, Stout & Kraus, LLP.

(57) ABSTRACT

The present invention provides an electric power converter in which a tip portion of a cooling fin on an air flow inlet side is limited to flow a large quantity of air around a connection portion, where the fin efficiency is high, of a base surface of the cooling fin and the fin so that the cooling efficiency of the cooling fin can be improved. By providing the limiting member, air or atmosphere flowing into the cooling fin is directed to flow toward the fin near the base surface. Further, by providing the limiting member, an area of a portion from which the air or atmosphere flows into the cooling fin is also limited so that the velocity of the air or atmosphere flow becomes high. By these functions and the like, the cooling efficiency of the cooling fin can be increased as compared to the prior art.

7 Claims, 6 Drawing Sheets

ELECTRIC POWER CONVERTER

BACKGROUND OF THE INVENTION

1. Field of the Invention

The present invention relates to an art of providing an electric power converter for supplying electric power to a motor, for example.

2. Description of Related Art

JP-A-6-38546 discloses cooling of an electric power converter (particularly see FIG. 1, and page 2). In JP-A-6-38546, by varying the length of a cooling fin at its circumferential part and at its inner part, it is intended to further improve cooling capability as compared to a conventional one. In the electric power converter, a conversion loss is generated in a diode bridge, and in a transistor module and an IGBT module which are inverse transforming elements, to generate heat. The heat generated due to the conversion loss is dissipated from the cooling fin by wind generated using a cooling fan so as not to thermally destroy semiconductors such as the diode and transistor. In general, it is said that silicon composing a semiconductor is destroyed when the temperature of the semiconductor becomes 150° C. or more, and therefore cooling is performed so that the temperature is equal to or below 150° C.

BRIEF SUMMARY OF THE INVENTION

As described also in the above prior art, in an electric power converter, it is necessary to attempt the dissipation and the cooling of the heat generated in its internal element or the like, and therefore various ideas and methods have been proposed.

In the electric power converter, as shown in FIG. 2, the electric power supplied from a commercial power source is input through terminals R, S, T, and converted into direct current in a diode three-phase bridge circuit 3. Thereafter, a capacitor 6 is used as a smoothing part for smoothing the direct current, and then the current is inversely transformed to perform frequency conversion by an inverter circuit 2 using a transistor module and an IGBT module which are switching elements.

In the electric power converter, a conversion loss is generated in the diode bridge and in the transistor module and the IGBT module which are inverse transforming elements, to generate heat. The heat is dissipated from a cooling fin by wind generated using a cooling fan so as not to thermally destroy semiconductors such as the diode and transistor.

Meanwhile, concerning the above described heat dissipation, the above semiconductor elements are placed on the cooling fin for air cooling, in general.

By performing this cooling efficiently, it is possible to attempt size reduction of a product.

Accordingly, it is generally preformed to enhance cooling efficiency of the cooling fin by forced air cooling of a fin portion by the fan.

Further, it is also possible to attempt the size reduction by changing the number of fins (blades) of the cooling fin, or varying space through which air flows.

Further, with respect to this cooling fin, it is also possible to promote the cooling by increasing its surface area and increasing the number of the fins of the cooling fin.

As described above, it has been broadly considered to improve the cooling efficiency by modifying the cooling fin. As a result, since the size and the performance of the product may be affected, these come into question when commercializing the electric power converter.

It is an object of the present invention to improve the cooling efficiency.

The present invention solves the above object in the following manner.

In a cooling fin of an electric power converter, in order to flow a large quantity of air around a connection portion of a base surface and a fin of the cooling fin at which connection portion the fin efficiency is high, a limiting member for limiting air or atmosphere flow is provided in a tip part of the fin which is opposite to the base surface, on a side from which air or atmosphere flows into the cooling fin.

By providing this limiting member, the air or atmosphere flowing into the cooling fin flows toward the fin near the base surface.

In addition, by providing the limiting member, an area of a portion from which air or atmosphere flows into the cooling fin is also limited so that the velocity of the air or atmosphere flow becomes high. With these functions and the like, the cooling efficiency of the cooling fin can be increased as compared to the prior art.

In addition, although the limiting member may be perpendicular to the base surface, by inclining the limiting member, a larger quantity of air or atmosphere flows toward or is directed to the base surface.

Further, in addition to the above described limiting member, a second limiting member may be provided on a side of the base surface, and on a side from which air or atmosphere flows into the cooling fin.

The above described configuration allows decrease in temperature of semiconductor elements and the like, not necessarily using a special cooling fin and fan. In this way, it is expected to achieve simplification and size reduction of the cooling fin of the electric power converter, for example.

According to the present invention described above, it is possible to provide an electric power converter with improved reliability as compared to the prior art.

Other objects, features and advantages of the invention will become apparent from the following description of the embodiments of the invention taken in conjunction with the accompanying drawings.

DETAILED DESCRIPTION OF THE INVENTION

Figure 1:
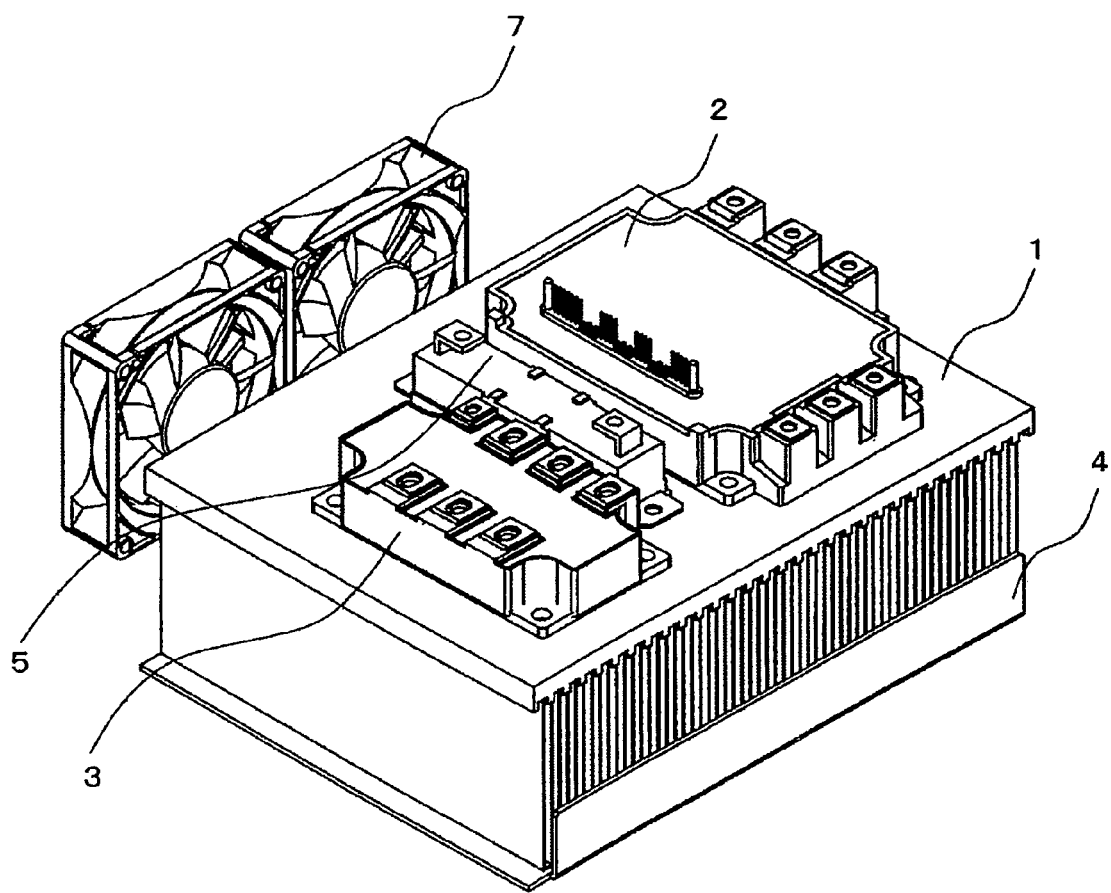
FIG. 1 is a structural view of an embodiment of the present invention.
Figure 2:
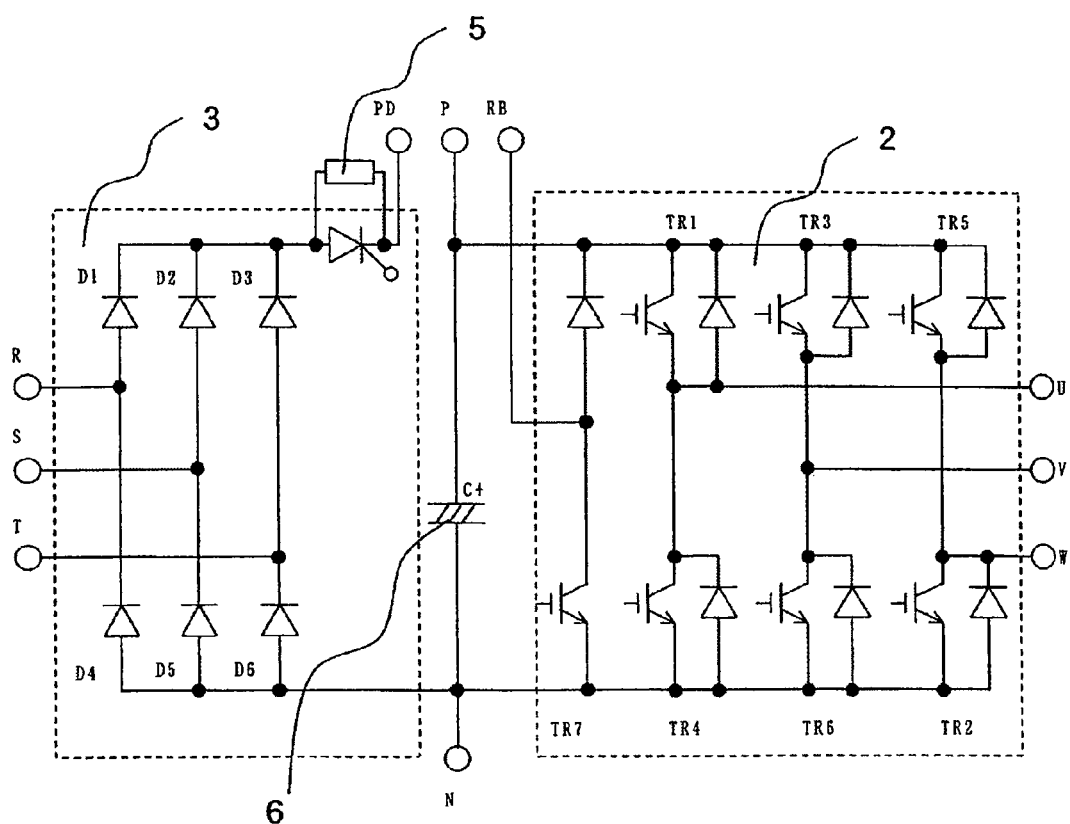
FIG. 2 is an electric wiring diagram of an electric power converter.

Hereinafter, a cooling structure according to the present invention will be described in detail with reference to embodiments shown in the drawing.

FIG. 1 illustrates one embodiment of an electric power converter according to the present invention. In this figure, reference numeral 1 denotes a cooling fin, reference numeral 2 denotes an IGBT module, reference numeral 3 denotes a diode module and reference numeral 4 denotes a limiting plate for limiting the flow of wind toward the fin. The limiting plate 4 is made by bending a lower side of a plate covering a bottom part (which is an opposite side to a base side) of the cooling fin.

Figure 3:
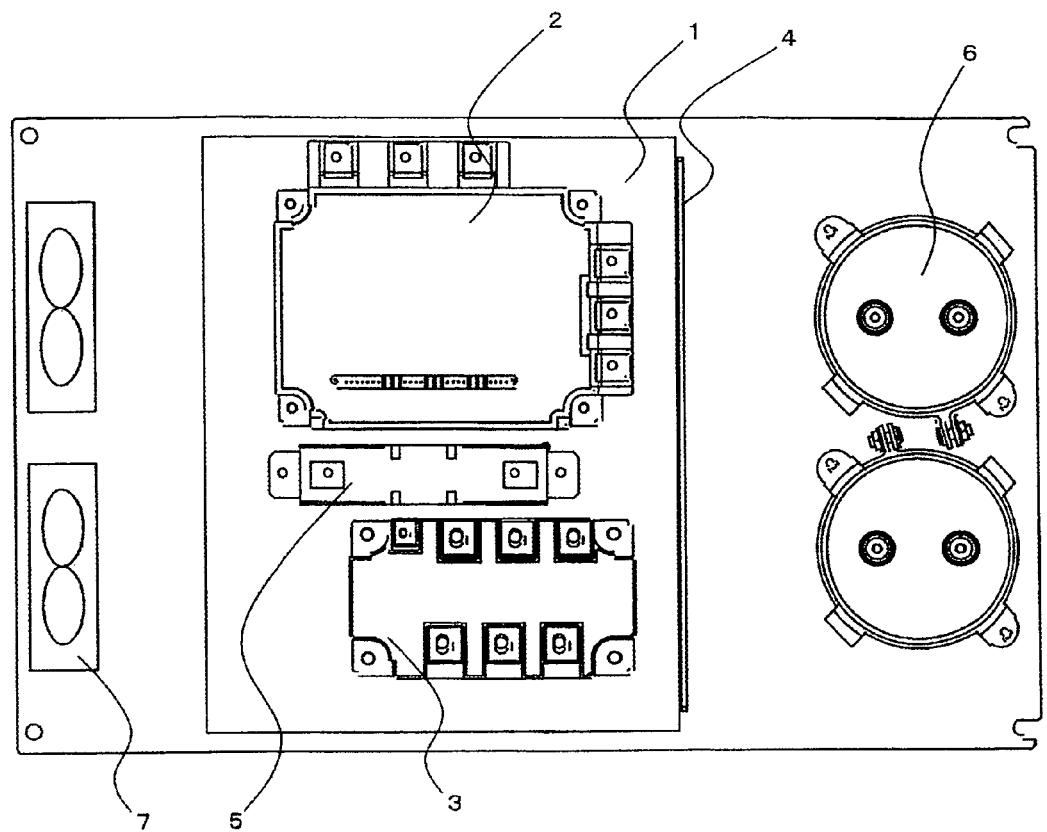
FIG. 3 is a practical placement view of the electric power converter of the embodiment of the present invention.

FIG. 3 shows practical placement of a main circuit part of the electric power converter. Reference numeral 5 denotes a rush current prevention resistor, reference numeral 6 denotes a smoothing capacitor and reference numeral 7 denotes a cooling fan.

A loss generated in the IGBT module 2 and the diode module 3 thermally conducts to the cooling fin 1. A cooling fin part of the fin 1 is configured so that wind is drawn out by the cooling fan 7 for the purpose of forced air cooling. As a result, heat generated in the IGBT module 2 and the diode module 3 is dissipated here, into ambient atmosphere air.

It is generally known that the cooling fin 1 has high efficiency at a back side of a base surface 1a and at a portion of a fin 1b close to the base surface 1a, and the efficiency decreases toward a tip of the fin 1b (on opposite side to the base surface 1a).

In addition, when considering the cooling fin 1 as one stream tube for example, the mass of fluid flowing though each cross-sectional area S of the stream tube per unit time is the same as that of the other if the stream tube does not have a portion where air gushes out or is sucked into. Thus, the following Numerical Expression 1 is generally known as a continuity equation.

$$\rho v S = \text{constant} \qquad \text{(Numerical Expression 1)}$$

where v is a fluid velocity, and ρ is a fluid density.

Here, Numerical Expression 2 is derived from Numerical Expression 1 as follows.

$$v2 = v1*(S1/S2) \qquad \text{(Numerical Expression 2)}$$

where v1 is a fluid velocity in cross-sectional area S1, and v2 is a fluid velocity in cross-sectional area S2.

Numerical Expression 2 shows that the fluid velocity v2 increases as the cross-sectional area S2 decreases.

According to this, by providing the limiting plate 4 for limiting wind toward the fin 7 on a tip side of the fin 1b to limit a flow passage area at an inlet in the fin tip part where the fin efficiency is low, the cross-sectional area corresponding to S2 in the above Numerical Expression 2 becomes decreased.

As a result, the wind velocity is increased in the base surface 1a and in the portion of the fin 1b close to the base surface 1a which are not limited by the limiting plate 4 and have high cooling fin efficiency, and by increasing the quantity of wind flowing through these portions per unit time, the cooling can be promoted as compared to the prior art.

Figure 4:
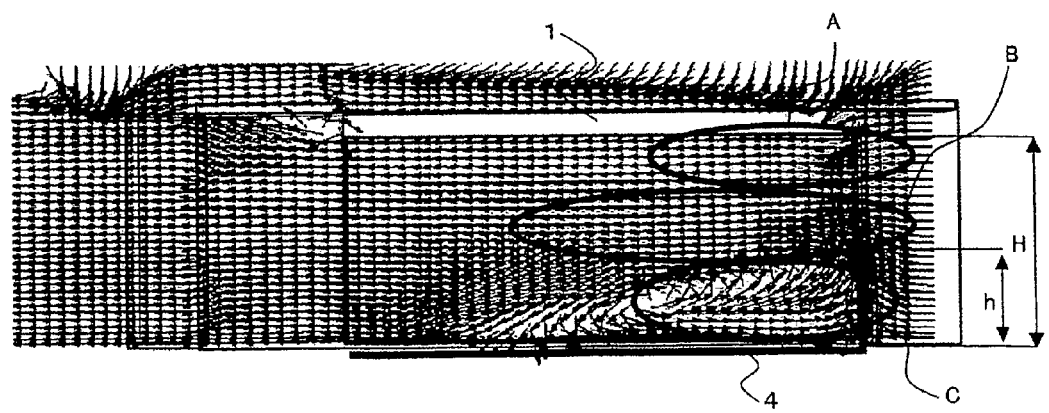
FIG. 4 shows a simulation result according to the embodiment of the present invention.

In connection with the above descried embodiment, FIG. 4 shows an analysis result based on simulation of flow of wind, wind velocity and the like in the case of providing the limiting plate 4. It can be seen from FIG. 4 that the wind velocity in the fin part near the base surface 1a of the cooling fin 1 becomes high by providing the limiting plate 4.

In FIG. 4, arrows denote the wind flows, the direction of each arrow denotes the direction of the wind, and the length of each arrow denotes the velocity of the wind. Thus, a longer arrow denotes a higher velocity of the wind.

In FIG. 4, by providing the limiting plate 4, change in wind flow occurs in the circle parts indicated by A, B and C in the figure.

First, with regard to the circle part A, the wind flow from right becomes fast in the part along the base surface 1a of the cooling fin 1. This is confirmed by the result that the arrows in the simulation in FIG. 4 are longer than those in the simulation in the case of not providing the limiting plate 4 (not shown).

It can be seen that, by the wind flow from right in the figure toward the fan on the left in the circle part A, the cooling efficiency in a portion along the base surface 1a of the cooling fin 1 can be improved as compared to the prior art.

Next, also in the circle part B, the wind flow from right becomes fast. This is confirmed by the fact that the arrows are longer than those in the simulation in the case of not providing the limiting plate 4, as is in the circle part A.

It can be seen that, by the wind flow from right in the figure toward the fan on the left in the circle part B, the cooling efficiency in a middle portion of the cooling fin 1 can be improved as compared to the prior art.

On the other hand, in the circle part C, the wind direction changes in an irregular manner, rather than the wind flow from right in the figure toward the fan on the left. Therefore, it seems that the cooling efficiency becomes lower than that in the circle parts A and B.

Figure 5:
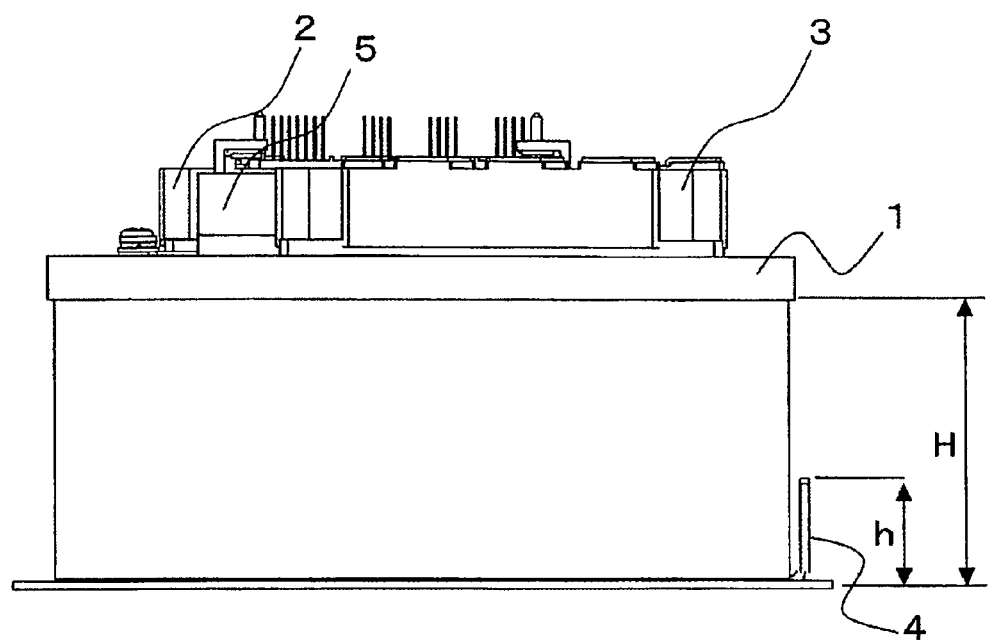
FIG. 5 is a structural view of the embodiment of the present invention.
Figure 6:
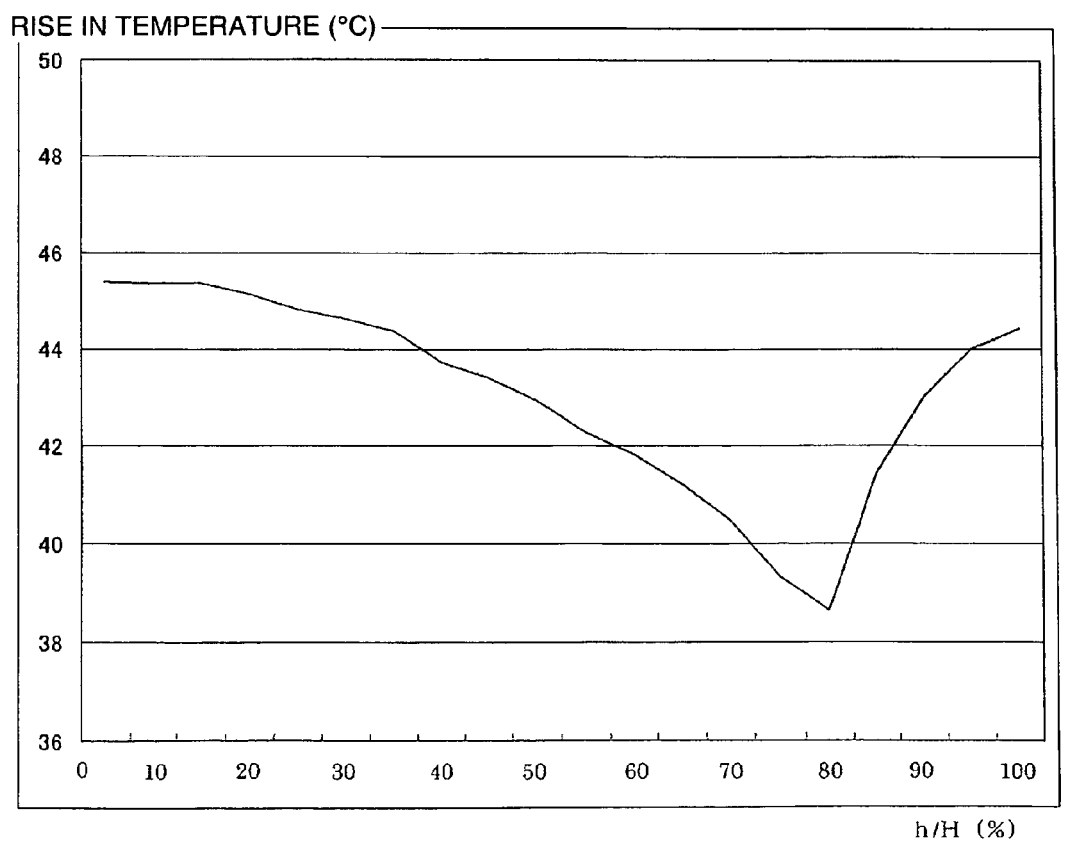
FIG. 6 shows a simulation result of the embodiment of the present invention.

In fact, it has been found also in simulation that a contribution ratio of the circle part C is lower than that of the circle parts A and B in terms of cooling of the cooling fin 1, even if the limiting plate 4 is not provided. Therefore, it is deemed that influence by providing the limiting plate 4 is small. Then, FIG. 6 shows a result obtained by simulation of change in temperature rise of the fin 1 when the length h of the limiting plate 4 in FIG. 5 is varied. In FIG. 5, reference character H denotes the length from a position at which a fin is attached to the base surface 1a of the cooling fin 1, to the tip of the fin, and the parameter of the horizontal axis in FIG. 6 is the ratio of the length h of the limiting plate 4 to the length H.

As can be seen from the result in FIG. 6, it has been determined in the simulation that, as the length h of the limiting plate 4 increases with respect to the fin length H, the effect of reducing the temperature rise is obtained accordingly.

Then, it can be understood from FIG. 6 that the effect of reducing the temperature rise is largest when h/H is about 80%.

It is expected from the result in FIG. 6 that the effect appears and becomes larger until the length h reaches up to 80% of the fin length H.

Although a large cooling efficiency is obtained at 80% in FIG. 6, it is conceivable that the ratio is made smaller than 80% in consideration of deposition and clogging of foreign matters to the cooling fin, etc. The ratio lower than 80% is expected to be preferable, also from the viewpoint of reducing generation and magnitude of wind sound when sucking air or atmosphere on a sucking side (an opposite side to the fan) of the cooling fin 1.

Again, as already described in connection with the circle part C in FIG. 4 and thus is repeat, it is found in the simulation and an actual confirmation based on the simulation that the limited portion has a low contribution ratio for cooling of the cooling fin when the length h of the limiting plate 4 is about 30%. Therefore, it is expected that problems are small with respect to the influence upon the cooling efficiency of the entire cooling fin and the like even if the length h of the limiting plate 4 is set and implemented in the order of 30%, because the above described portion in the order of 30% inherently has a small contribution ratio for cooling.

In addition, it can be said that implementation in the order of 30% to 60% is preferable in consideration of the above described deposition and clogging of foreign matters to the cooling fin, etc. In such a range, generation and magnitude of wind sound when sucking air or atmosphere on the sucking side of the cooling fin 1 can be reduced to an insignificant level.

It was also confirmed with an actual prototype that good cooling effect can be obtained at about 35% as compared to the prior art, and wind sound when sucking is insignificant, etc.

Figure 7:
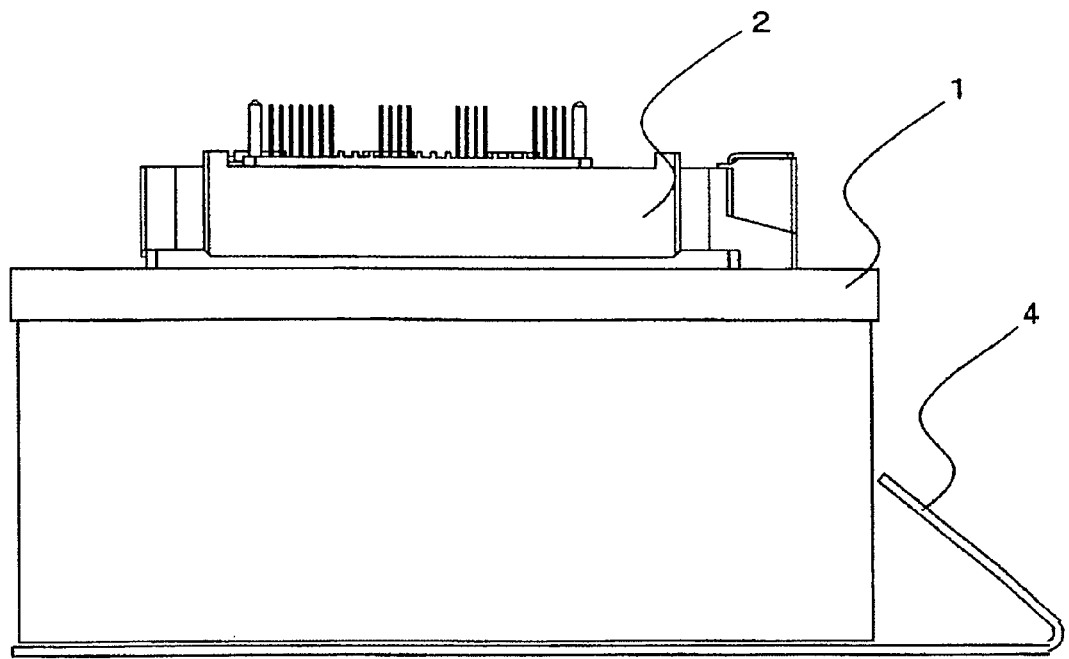
FIG. 7 is another embodiment of the present invention.

Next, FIG. 7 shows another embodiment according to the present invention.

In FIG. 7, the limiting plate 4 is provided in an inclined manner. The configuration as in FIG. 7 aims to direct the wind flow toward the fin portion near the base surface 1*a* of the cooling fin 1 so as to further increase the wind velocity.

Figure 8:
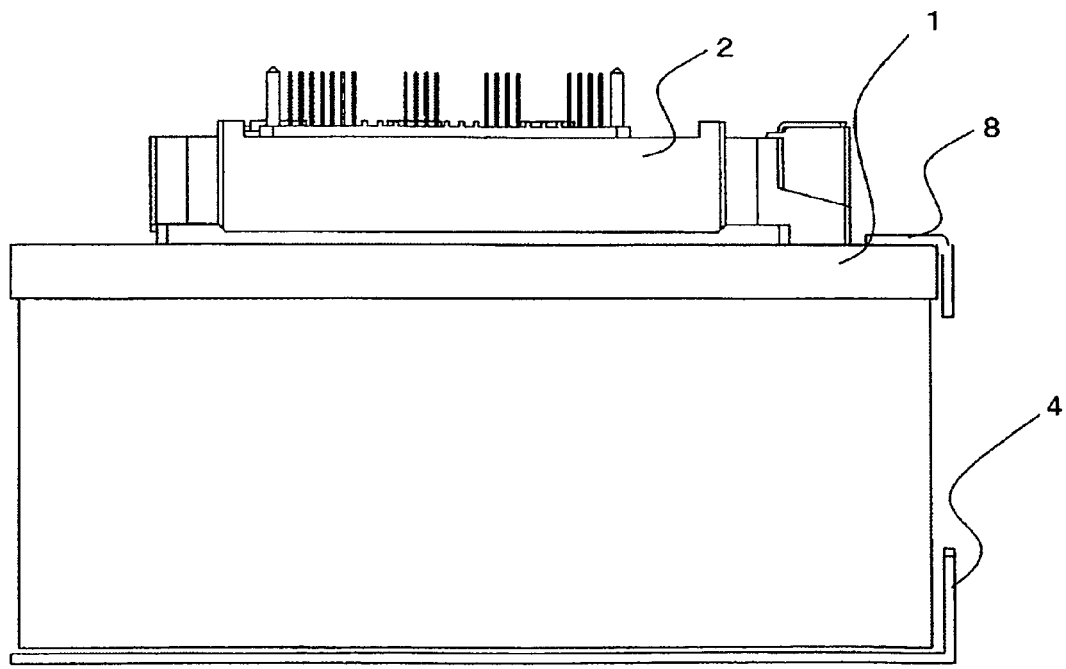
FIG. 8 is a further embodiment of the present invention.

Further, FIG. 8 shows still further embodiment according to the present invention.

In FIG. 8, a limiting plate 8 for limiting wind flow is also provided on a side of the base surface 1*a* of the cooling fin 1.

Providing the limiting plate 8 aims to cause change in wind flow in order to improve the cooling efficiency of the fin near the base surface 1*a* of the cooling fin 1. Here, change in wind flow means turbulent flow which is said as flow in which small parts of fluid are irregularly mixed to include turbulence, irregular flow or the like.

The above described limiting plate 4 may be provided by bending a part of a housing which supports the cooling fin 1 and the like. In this way, another step of attaching the limiting plate 4 or the like may be eliminated and it is also possible to achieve reduction in the number of parts.

Figure 9:
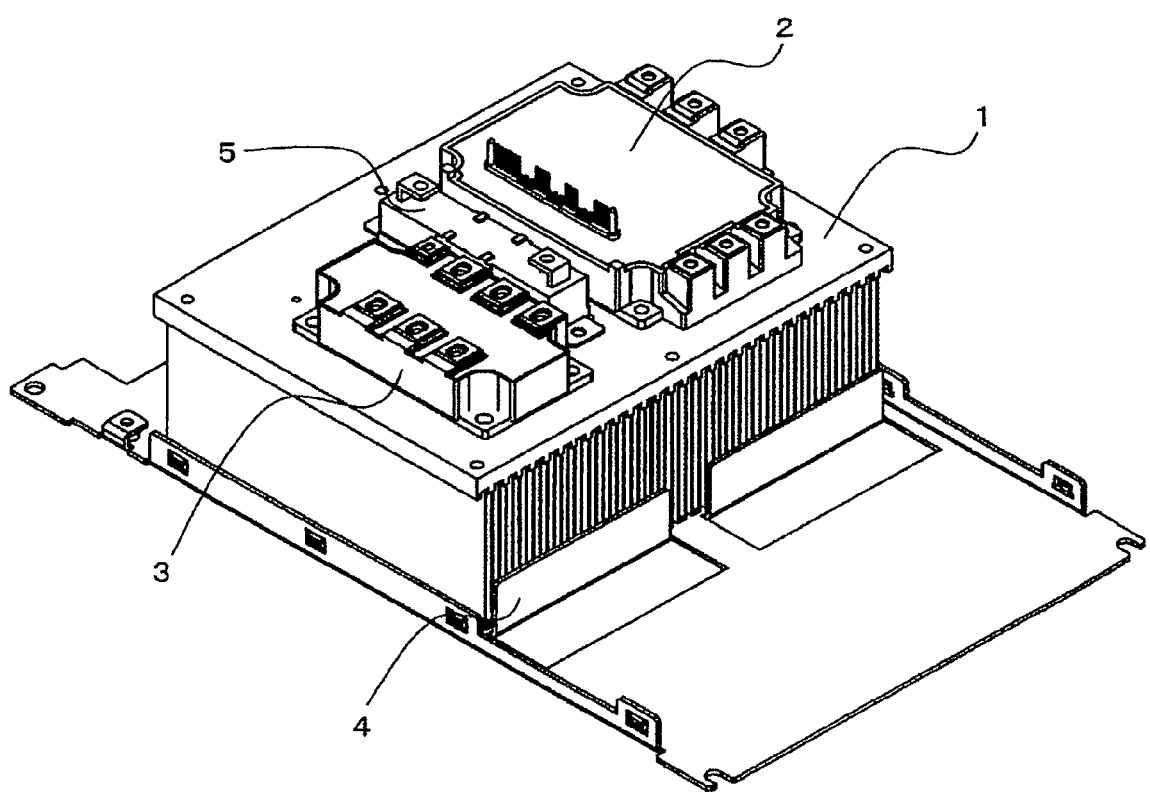
FIG. 9 is a still further embodiment of the present invention.

FIG. 9 shows an embodiment in which the limiting plate 4 is provided by bending. Further, a portion in the middle of the limiting plate 4 is not bended with the aim of keeping the strength of the housing part to a certain extent. Although the limiting plate 4 is absent in the portion which has not been bended, it is deemed that there is no problem thereby because its influence upon the cooling efficiency can be small.

Embodiments of the present invention are not limited to the above described embodiments and those may be modified as appropriate. For example, instead of providing the limiting plate 4 in a bended manner as in FIG. 9, the limiting plate 4 may be provided in such a way that the limiting plate 4 is supported by the housing part.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electric power converter comprising:
   a rectifying part for converting supplied alternating current power into direct current power;
   a smoothing part for smoothing output from the rectifying part;
   an inverse transforming part for converting output from the smoothing part into alternating current power;
   a controlling part for controlling the inverse transforming part;
   a cooling part for cooling heat generated at least in the inverse transforming part, the cooling part comprising a fin for dissipating heat and a base surface on which the fin is supported; and
   a housing for supporting the rectifying part, the smoothing part, the inverse transforming part, the controlling part and the cooling part, wherein
   an atmosphere limiting part for changing flow of atmosphere flowing in the cooling part is provided at an opening portion of the fin on an opposite side to the base surface of the cooling part.

2. The electric power converter according to claim 1, wherein the length of the fin and the length of the atmosphere limiting part have the following relationship:

$0<=h/H<=0.8$.

3. The electric power converter according to claim 1, wherein a second atmosphere limiting part is also provided on a side of the base surface.

4. The electric power converter according to claim 1, wherein the atmosphere limiting part is provided with an inclined part which inclines toward the base surface.

5. The electric power converter according to claim 1, wherein the atmosphere limiting part is provided by bending a part of the housing.

6. The electric power converter according to claim 5, wherein the atmosphere limiting part comprises a portion where a part of the housing is not bended.

7. The electric power converter according to claim 5, wherein a generally middle portion of the part of the housing which forms the atmosphere limiting part is not bended.

* * * * *